United States Patent
Yamane et al.

(10) Patent No.: US 8,005,134 B2
(45) Date of Patent: Aug. 23, 2011

(54) WAVEFORM SHAPING DEVICE AND ERROR MEASUREMENT DEVICE

(75) Inventors: Kazuhiro Yamane, Atsugi (JP);
Kazuhiro Fujinuma, Ebina (JP)

(73) Assignee: Anritsu Corporation, Atsugi-shi (JP)

( * ) Notice: Subject to any disclaimer, the term of this patent is extended or adjusted under 35 U.S.C. 154(b) by 533 days.

(21) Appl. No.: 12/295,227

(22) PCT Filed: Mar. 26, 2007

(86) PCT No.: PCT/JP2007/056243
§ 371 (c)(1),
(2), (4) Date: Sep. 29, 2008

(87) PCT Pub. No.: WO2007/116697
PCT Pub. Date: Oct. 18, 2007

(65) Prior Publication Data
US 2009/0279595 A1    Nov. 12, 2009

(30) Foreign Application Priority Data

Mar. 31, 2006 (JP) ................................. 2006-099908

(51) Int. Cl.
*H03H 7/30* (2006.01)
*H03H 7/40* (2006.01)
*H03K 5/159* (2006.01)

(52) U.S. Cl. ........ 375/232; 375/229; 375/230; 375/346; 375/340; 375/317; 341/72

(58) Field of Classification Search ............. 375/232, 375/229, 230, 346, 350, 340, 317; 341/72
See application file for complete search history.

(56) References Cited

U.S. PATENT DOCUMENTS

| 3,713,140 | A | * | 1/1973 | Meslener | 341/72 |
| 4,267,595 | A | * | 5/1981 | Hernandez | 375/342 |
| 5,052,021 | A | | 9/1991 | Goto et al. | |
| 6,496,548 | B1 | * | 12/2002 | Schneider et al. | 375/317 |
| 6,529,565 | B1 | * | 3/2003 | Kawai | 375/334 |
| 7,463,309 | B2 | * | 12/2008 | Matsuo et al. | 348/465 |

FOREIGN PATENT DOCUMENTS

| JP | A 2-305149 | 12/1990 |
| JP | A 5-7135 | 1/1993 |
| JP | A 8-88625 | 4/1996 |
| JP | A 11-190759 | 7/1999 |

* cited by examiner

*Primary Examiner* — Phuong Phu
(74) *Attorney, Agent, or Firm* — Greer, Burns & Crain, Ltd.

(57) ABSTRACT

The object of the present invention is to provide a waveform shaping device and an error measurement device which can perform a waveform shaping operation with the sufficient amplitude margin, even if the mark ratio of the inputted data signal is significantly varied and the amplitude of the inputted data signal is decreased. The waveform shaping device according to the present invention comprises a voltage detector (22) for detecting an inputted data signal (Da) to obtain an amplitude value and the center amplitude voltage of the inputted data signal (Da), a reference voltage generator (23) for generate the reference voltage corresponding to the center amplitude voltage, and a comparator (25) for comparing the inputted data signal (Da) with the reference voltage, and in which the waveform shaping device further comprises a correction information outputting section (27) for outputting correction information $\Delta V$ on the basis of a mark ratio (M) and an amplitude of the inputted data signal (Da), the correction information $\Delta V$ used to correct the center amplitude voltage detected by the voltage detector (22), and a correction section (28) correct the reference voltage or the inputted data signal to be inputted to the comparator (25) on the basis of the correction information ($\Delta V$).

11 Claims, 7 Drawing Sheets

WAVEFORM SHAPING DEVICE AND ERROR MEASUREMENT DEVICE

This application is a U.S. National Phase under 35 U.S.C. §371, of International Application No. PCT/JP2007/056243, filed Mar. 26, 2007.

TECHNICAL FIELD

The present invention relates to a waveform shaping device for removing an amplitude fluctuation from an inputted data signal by performing a waveform shaping operation on the inputted data signal, and more particularly to a waveform shaping device capable of accurately performing the waveform shaping operation with no influence of an amplitude and a mark ratio of the inputted data signal.

BACKGROUND ART

As one typical method of performing a performance evaluation on a data signal processing equipment or a transmission line, there has so far been proposed a method including the steps of inputting a data signal having a reference pattern as a test signal to an evaluation object, and measuring a bit error rate of a data signal outputted from the evaluation object.

The aforementioned method is realized by an error measurement device comprising a waveform shaping device for removing an amplitude fluctuation from the data signal outputted by the evaluation object. The error measurement device is designed to perform a bit state reading operation on the waveform-shaped data signal with a phase corrected clock to remove a phase fluctuation. In addition, the error measurement device is designed to compare each bit of the data signal without the amplitude and phase fluctuation with each bit of the pattern of the test signal to be inputted to the evaluation object in order to obtain the error rate.

As previously mentioned, the conventional error measurement device is designed to obtain the bit error rate after removing the amplitude and phase fluctuation from the data signal by the waveform shaping operation and the bit state reading operation with the clock signal. The conventional error measurement device is, for example, disclosed in the following patent documents 1 and 2.

Patent Document 1: Japanese Patent Laid-Open Publication H5-7135
Patent Document 2: Japanese Patent Laid-Open Publication H8-88625

DISCLOSURE OF INVENTION

Problem to be Solved by the Invention

Each of the patent documents 1 and 2 discloses a technology for responding to a varied direct-current offset of the inputted data signal. The technology includes the steps of obtaining a center amplitude voltage by detecting the inputted data signal, and varying a reference voltage used in the waveform shaping operation in accordance with the center amplitude voltage.

The above mentioned conventional technology, however, encounters such a problem that the detected center voltage has an error in accordance with the mark ratio of the data signal in case that the amplitude of the inputted data signal is detected by a voltage detector as previously mentioned. The influence of the error becomes large in response to the decreased amplitude of the data signal. This results in the fact that the conventional error measurement device performs the waveform shaping operation at the timing when an amplitude margin is not enough. The conventional error measurement device can, therefore, not accurately perform the error measurement.

It is, therefore, an object of the present invention to provide a waveform shaping device and an error measurement device which can perform the waveform shaping operation with the sufficient amplitude margin, even if the amplitude of the data signal is small and the mark ratio of the data signal is significantly varied.

Means for Resolving the Problem

According to a first aspect of the present invention, there is provided a waveform shaping device comprising: a comparator (25) for comparing an inputted data signal with a threshold to shape a waveform of the inputted data signal; and a voltage detector (22) for detecting an amplitude voltage and a center amplitude voltage of the inputted data signal, and in which the waveform shaping device further comprises: a correction information outputting section (27) for outputting correction information on the basis of a mark ratio (M) of the inputted data signal and the amplitude voltage; and a correction section (28) for correcting one of direct-current offset values of the inputted data signal and the threshold on the basis of the correction information outputted from the correction information outputting section.

The correction information may be determined on the basis of at least one coefficient and the amplitude voltage detected by the voltage detector, the coefficient preliminarily determined in accordance with each combination of an ambient temperature of the waveform shaping device, a bit rate of the inputted data signal, and the mark ratio of the inputted data signal.

According to a second aspect of the present invention, there is provided an error measurement device comprising: a waveform shaping device (21) for shaping a waveform of an inputted data signal; a variable delay device (31) for relatively shifting phases of the waveform-shaped data signal and an inputted clock; and a decision device (30) for reading a bit state from the waveform-shaped data signal while receiving the waveform-shaped data signal and the inputted clock signal relatively phase shifted by the variable delay device, the error measurement device designed to measure a bit error of the inputted data signal on the basis of a decided data signal outputted from the decision device, and in which the waveform shaping device is designed as above mentioned.

The error measurement device may further comprise a reference signal generator (41) for outputting a mark ratio of a specified reference signal as that of the waveform-shaped data signal to the correction information outputting section (27).

The error measurement device may further comprise: a delay device (32a) for delaying in units of bits the decided data signal outputted from the decision device; a first phase detector (32b) for outputting a voltage corresponding to a phase difference between the data signal outputted from the waveform shaping device and the decided data signal outputted from the decision device; a second phase detector (32c) for outputting a voltage corresponding to a phase difference between the decided data signal and a data signal outputted from the delay device; a third phase detector (32d) for outputting a base voltage with respect to the voltage outputted from the first phase detector; and a phase controller (33) for controlling a phase shift amount of the variable delay device to equalize the voltage outputted from the first phase detector to a center voltage between the voltage outputted from the second phase detector and the base voltage.

The first to third phase detectors may be respectively constituted by identically constructed phase detectors, and the third phase detector may be designed to output the base voltage corresponding to a phase difference between digital data signals having the identical bit, and identical phase.

According to a third aspect of the present invention, there is provided a waveform shaping device (21") comprising: a first voltage detector (22A) for detecting a first amplitude voltage and a first center amplitude voltage of a first inputted data signal constituting a differential digital signal; a second voltage detector (22B) for detecting a second amplitude voltage and a second center amplitude voltage of a second inputted data signal constituting the differential digital signal; a comparator (25) for comparing the first inputted data signal with the second inputted data signal to convert the differential digital signal into a digital signal, and in which the waveform shaping device further comprises: a first correction information outputting section (27A) for outputting first correction information on the basis of a mark ratio of the first inputted data and the first amplitude voltage; a first correction section (28A) for correcting a direct-current offset value of the first inputted data signal on the basis of the first correction information; a second correction information outputting section (27B) for outputting second correction information on the basis of a mark ratio of the second inputted data and the second amplitude voltage; a second correction section (28B) for correcting a direct-current offset value of the second inputted data signal on the basis of the second correction information.

According to a fourth aspect of the present invention, there is provided an error measurement device comprising: a waveform shaping device (21") for comparing first inputted data signal with second inputted data signal constituting a differential digital signal to output a waveform-shaped data signal while receiving the differential digital signal; a variable delay device (31) for relatively shifting phases of the waveform-shaped data signal and an inputted clock; and a decision device (30) for reading a bit state from the waveform-shaped data signal while receiving the waveform-shaped data signal and the inputted clock signal relatively phase shifted by the variable delay device, the error measurement device designed to measure a bit error of the differential digital signal on the basis of a decided data signal outputted from the decision device, and in which the waveform shaping device (21") is designed as above mentioned.

The error measurement device may further comprise a reference signal generator (41) for outputting a mark ratio of a specified reference signal as that of the differential digital signal to the first and second correction information outputting sections.

The error measurement device may further comprise: a delay device (32a) for delaying in units of bits the decided data signal outputted from the decision device; a first phase detector (32b) for outputting a voltage corresponding to a phase difference between the data signal outputted from the waveform shaping device and the decided data signal outputted from the decision device; a second phase detector (32c) for outputting a voltage corresponding to a phase difference between the decided data signal and a data signal outputted from the delay device; a third phase detector (32d) for outputting a base voltage with respect to the voltage outputted from the first phase detector; and a phase controller (33) for controlling a phase shift amount of the variable delay device to equalize the voltage outputted from the first phase detector to a center voltage between the voltage outputted from the second phase detector and the base voltage.

The first to third phase detectors may be respectively constituted by identically constructed phase detectors, and the third phase detector may be designed to output the base voltage corresponding to a phase difference between digital data signals having the identical bit, and identical phase.

Effects of the Invention

As mentioned above, the waveform shaping device and the error measurement device according to the present invention are designed to correct the direct-current bias of the data signal or the reference voltage in accordance with the amplitude of the inputted data and the appropriate mark ratio. The data signal and the reference voltage are inputted to the comparator. This leads to the fact that the waveform shaping device and the error measurement device according to the present invention can perform the waveform shaping operation with the sufficient amplitude margin, even if the mark ratio of the data signal is significantly varied and the amplitude of the data signal is decreased.

The waveform shaping device and the error measurement device can perform the data decision, in addition to the waveform shaping operation, at the timing when the phase margin is the most sufficient.

EXPLANATION OF REFERENCE NUMERALS 20 error measurement device
21 waveform shaping device
22, 22A, 22B voltage detector
23 reference voltage generator
24, 24A, 24B bias voltage generator
25 comparator
27, 27A, 27B correction information outputting section
28, 28A, 28B correction section
29, 29A, 29B level shifter
30 decision device
31 variable delay device
32 phase detector
33 phase controller
40 error measurement section
41 reference signal generator
42 bit comparator
43 operation section

DESCRIPTION OF THE PREFERRED EMBODIMENTS

First Preferred Embodiment

The preferred embodiments of the present invention will be described hereinafter with reference to the drawings.

Figure 1:
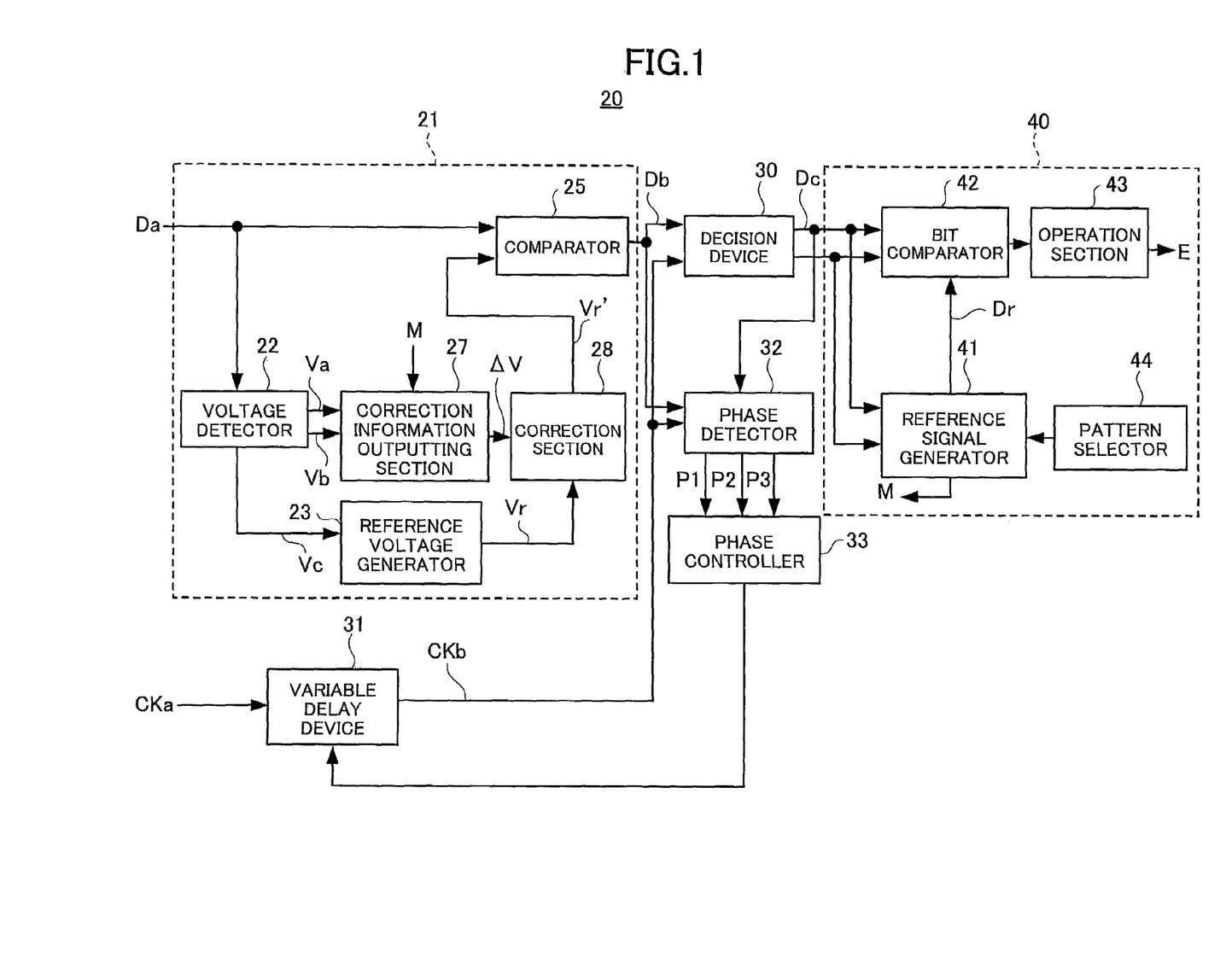
FIG. 1 is a block diagram showing a construction of the preferred embodiment according to the present invention.

FIG. 1 shows a construction of an error measurement device 20 having a waveform shaping device 21 according to the present invention.

The waveform shaping device 21 comprises a voltage detector 22, a reference voltage generator 23, a comparator 25, a correction information outputting section 27 and a correction section 28.

The voltage detector 22 is designed to detect an inputted data signal Da to obtain an amplitude value and a center amplitude voltage of the inputted data signal Da.

Figure 2:
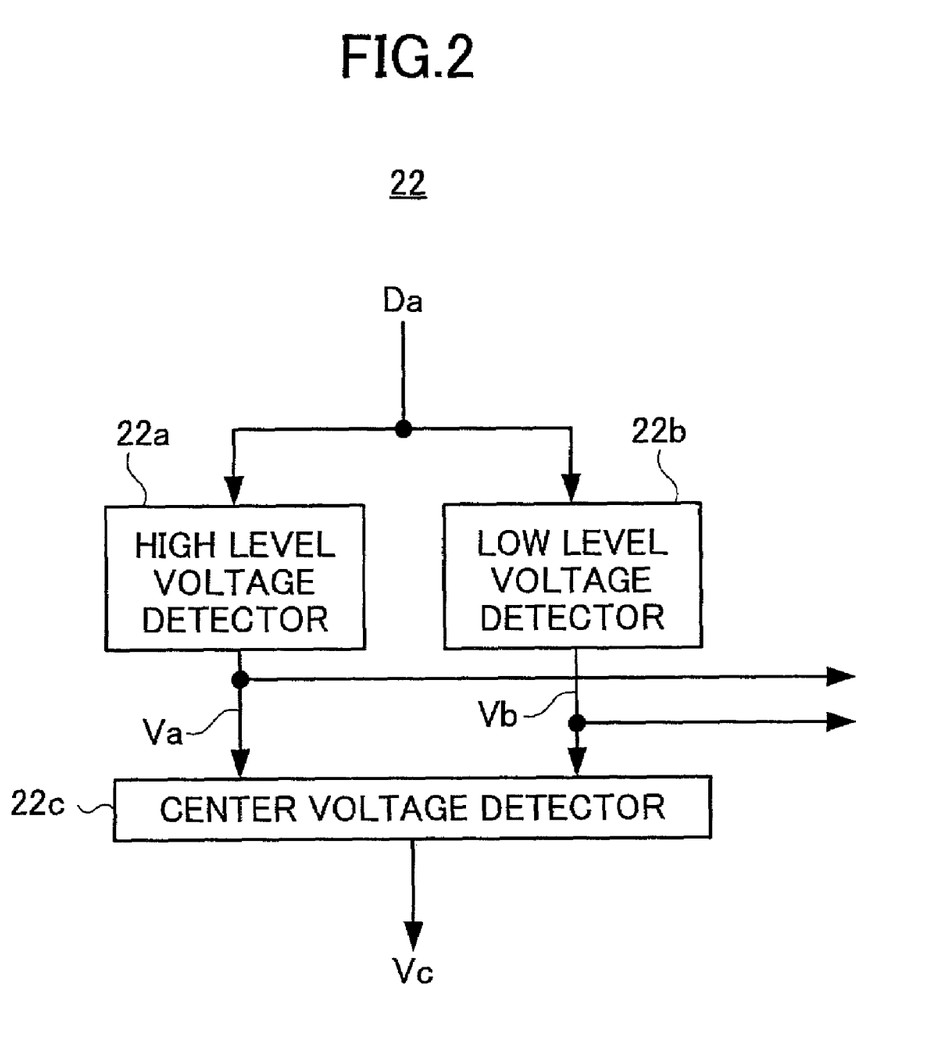
FIG. 2 is a block diagram showing an example of a constitution of a principal section of the preferred embodiment.

More specifically, as shown in FIG. 2, the voltage detector 22 has a high level voltage detector 22a for performing diode detection to detect a high level voltage Va of the inputted data signal Da, a low level voltage detector 22b for performing diode detection to detect a low level voltage Vb of the inputted data signal Da, and a center voltage detector 22c for calculating the center amplitude voltage Vc=(Va+Vb)/2.

The reference voltage generator 23 is designed to generate the reference voltage Vr corresponding to the center amplitude voltage Vc detected by the voltage detector 22. The reference voltage Vr is corrected by the correction section 28 which will be described hereinafter in detail. The reference voltage generator 23 is, for example, constituted by a low pass filter. The waveform shaping device 21 may not have the reference voltage generator 23 in case that pulsating of the center amplitude voltage Vc is sufficiently small. In this case, the center amplitude voltage Vc can be regarded as the reference voltage Vr.

The comparator 25 is adapted to compare the inputted data signal Da with a corrected reference voltage Vr' to produce a waveform-shaped data signal Db. The waveform-shaped data signal Db, for example, has a high level when the voltage of the inputted data signal Da is higher than the reference voltage Vr', and a low level when the voltage of the inputted data signal Da is lower than or equal to the reference voltage Vr'. The comparator 25 is adapted to output the waveform-shaped data signal Db to a decision device 30 which will be described hereinafter.

The correction information outputting section 27 is designed to output correction information $\Delta V$ to the correction section 28 on the basis of a mark ratio M outputted from a reference signal generator 41 and the amplitude of the inputted data signal. The reference signal generator 41 will become apparent as the following description. The correction information $\Delta V$ is used to correct an error in the center amplitude voltage Vc detected by the voltage detector 22.

The correction section 28 is designed to correct the reference voltage Vr on the basis of the correction information $\Delta V$. In this embodiment, the correction section 28 is designed to perform subtraction or addition correction to correct the reference voltage Vr. While there has been described about the fact that the comparator 25 is adapted to correct the reference voltage with respect to the directly inputted data signal, the waveform shaping device 21 may further comprise a level shifter for shifting a direct-current offset of the inputted data signal to be inputted to the comparator 25 under the state that the reference voltage is fixed according to the present invention, as described hereinafter.

The relationships between the mark ratio of the data signal and the detected output will be described hereinafter on the assumption that the mark ratio is "(the number of bits of the high level data)/(the number of all bits)". The high mark ratio causes a high mean value of a positive side (high level side) of the detected output value and a high mean value of a negative side (low level side) of the detected output values.

Figure 3:
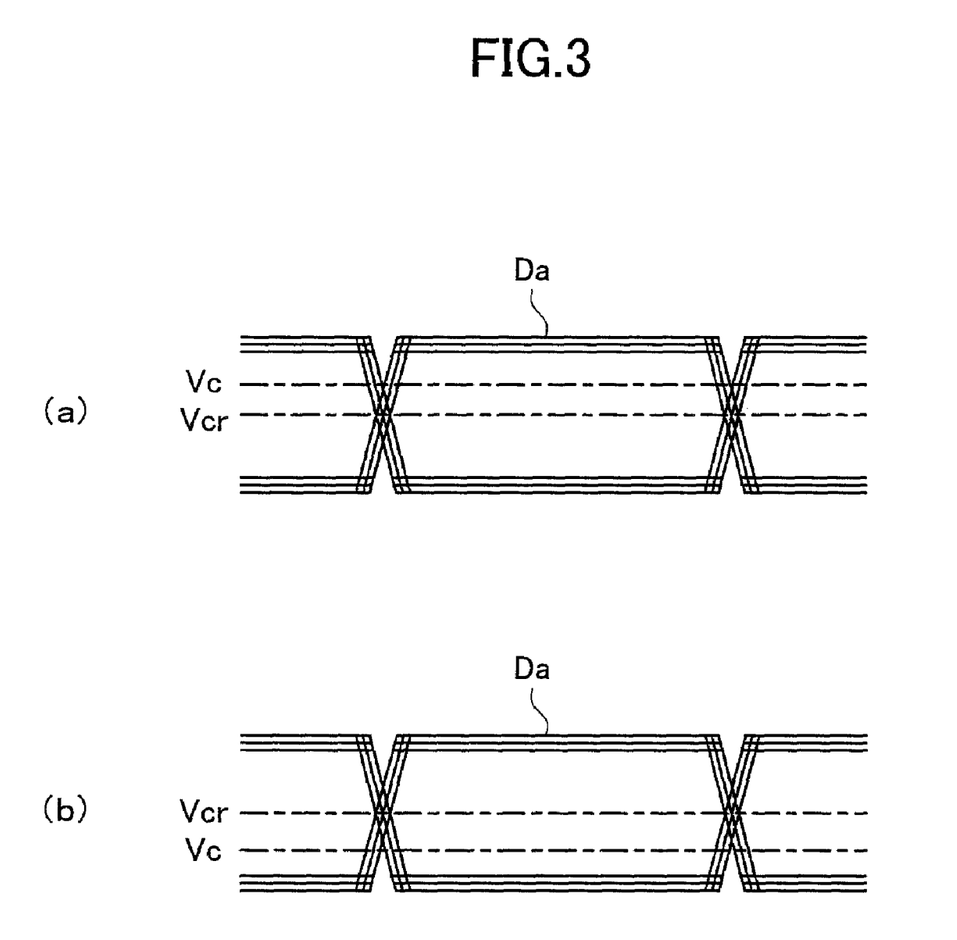
FIG. 3 is a graph to explain a method of the principal section of the preferred embodiment.

This leads to the fact that, as shown in FIG. 3 (a), the center value Vc between the positive and negative detected output values becomes higher than the real center amplitude value Vcr, viz., the amplitude margin becomes small.

In contrast, the low mark ratio causes the low mean value of the positive side (high level side) of the detected output value and a low mean value of the negative side (low level side) of the detected output values.

This leads to the fact that, as shown in FIG. 3 (b), the center value Vc between the positive and negative detected output values becomes lower than the real center amplitude value Vcr, viz., the amplitude margin also becomes small.

Additionally, if the inputted data signal has a small amplitude and a low S/N ratio, the amplitude margin becomes inevitably small, viz., the amplitude margin with respect to the varied mark ratio becomes increasingly small.

For these reasons, the waveform shaping device 21 has a memory (not shown in the figures) for preliminarily storing therein the correction information $\Delta V$ corresponding to the mark ratio M and the amplitude. The correction information $\Delta V$, for example, indicates the error $\Delta V$ between the center value Vc of the detected output values and the real center amplitude value Vcr of the data signal. The error $\Delta V$ is preliminarily obtained from the data signals each having the different mark ratio and amplitude value. The correction information outputting section 27 is designed to read the correction information $\Delta V$ on the basis of the amplitude value detected by the voltage detector 22 and the mark ratio M from the memory. The correction section 28 is designed to add the correction information $\Delta V$ to the reference voltage Vr to output the comparator 25.

The waveform shaping device 21 thus constructed can perform the waveform shaping operation with the sufficient amplitude margin, even if the amplitude of the data signal is small and the mark ratio of the data signal is significantly varied.

While there has been described about the fact that the correction information outputting section 27 is designed to read the correction information preliminarily stored in the memory to use, the correction information outputting section 27 may be designed to perform an arithmetic processing operation to calculate the correction information $\Delta V$ at each time of the measurement according to the present invention. The arithmetic processing operation is determined in accordance with the form of the circuit. The error of the center value tends to be highly affected by the mark ratio and the amplitude. The correction information $\Delta V$ is, therefore, calculated in accordance with the following equation based on coefficients $\alpha$ and $\beta$, a deference between the mark ratio and 50%, and an amplitude (Va−Vb).

$$\Delta V = (M - 0.5)[\alpha(Va - Vb) + \beta]$$

The coefficients $\alpha$ and $\beta$ are not respectively limited to constants. The coefficients $\alpha$ and $\beta$ may be, for example, preliminarily determined by each combination of a surrounding temperature of the waveform shaping device 21, a bit-rate of the inputted data signal Da (i.e., a frequency of an inputted clock CKa), and the mark ratio M of the inputted data signal Da to be stored in the abovementioned memory according to the present invention. In this case, the correction information outputting section 27 is designed to select the coefficients α and β from contents stored in the memory in accordance with the measurement conditions.

The correction information outputting section 27 is further designed to calculate the correction information $\varDelta V$ by using of the above described equation on the basis of the amplitude value (Va−Vb), the coefficients α and β, and the mark ratio. The amplitude value (Va−Vb) is obtained from Va and Vb detected by the voltage detector 22. The coefficients α and β are selected by the manner previously mentioned.

It is assumed that the coefficients α and β are discretely predetermined by each combination of the surrounding temperature of the waveform shaping device 21, the bit-rate of the inputted data signal Da, and the mark ratio M of the inputted data signal Da. If the coefficients α and β are predetermined, for example, in 1 Gbps and 5 Gbps of the bit-rate of the inputted data signal Da, the correction information outputting section 27 can calculate the correction information $\varDelta V$ in 3 Gbps of the bit-rate by use of the linear interpolation or the like at the time of the measurement. The correction information outputting section 27 can, therefore, calculate the correction information $\varDelta V$ under any measurement conditions.

The correction information outputting section 27 may be designed to obtain the correction information $\varDelta V$ from the memory with no use of the above described equation according to the present invention. In this case, the above mentioned combination further includes the amplitude value (Va−Vb).

As shown in FIG. 1, the data signal Db thus waveform shaped is inputted to the decision device 30. The inputted clock CKa from outside with the inputted data signal Da is delayed by the variable delay device 31. The delayed clock CKb is inputted to the decision device 30.

Figure 4:
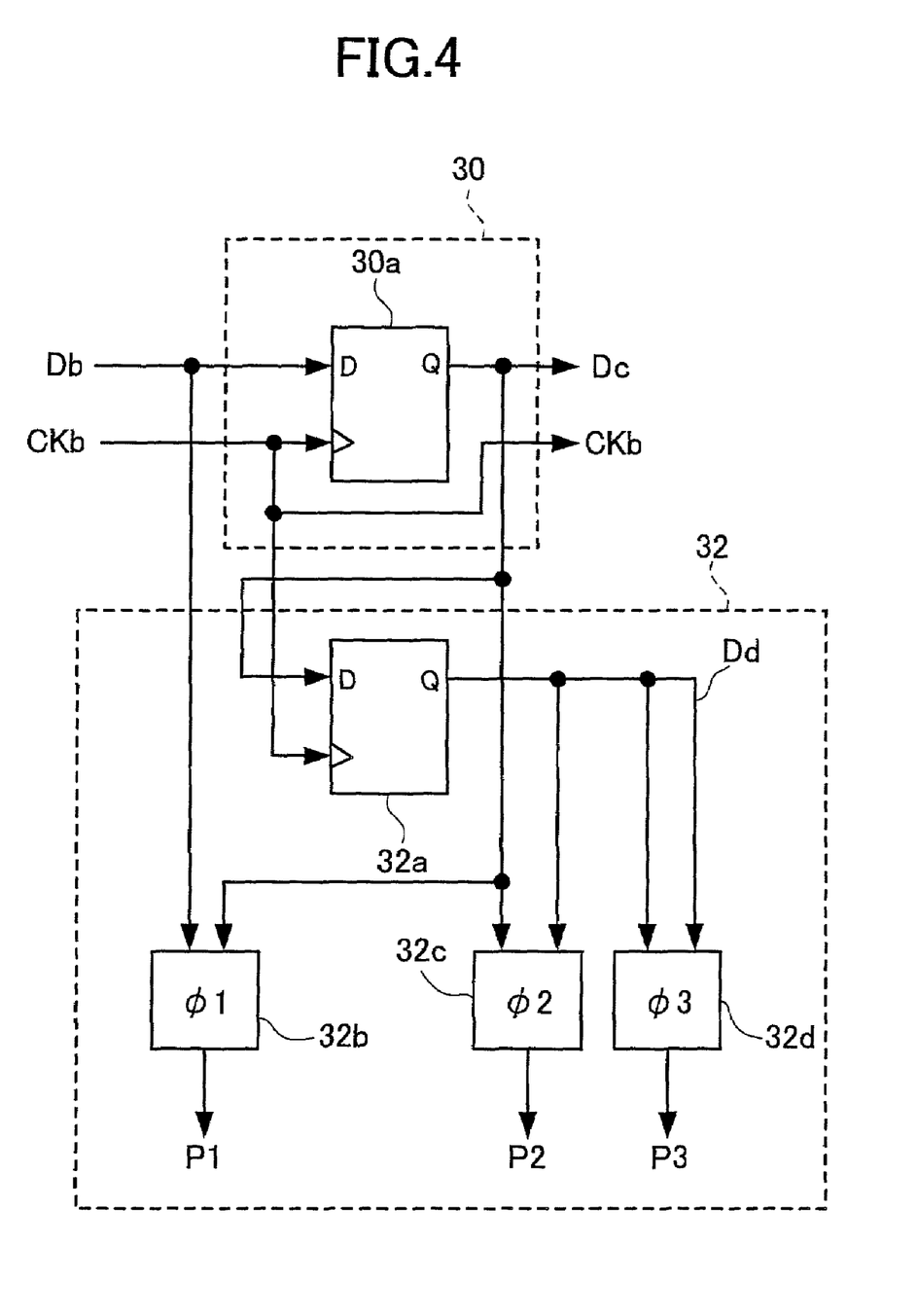
FIG. 4 is a block diagram showing an example of a constitution of other principal section of the preferred embodiment.

As shown in FIG. 4, the decision device 30 is constituted by a flip-flop circuit 30a to latch a bit state of the data signal Db at one of level transition timings (e.g., rise time) of the clock CKb to output the result of the latching to an error measurement section 40 as a decided data signal Dc.

The phase detector 32 is designed to produce three signals P1 to P3 required to judge whether or not a decision timing of the decision device 30, i.e., the level transition timing of the clock signal CKb, is appropriate, while receiving the data signal Db and the decided data signal Dc outputted from the decision device 30.

More specifically, as shown in FIG. 4, the phase detector 32 has a delay device 32a constituted by a flip-flop circuit to delay the decided data signal Dc by one bit, a first phase detector 32b for detecting a phase difference between the data signal Db and the decided data signal Dc, a second phase detector 32c for detecting a phase difference between the decided data signal Dc and the data signal Dd outputted from the delay device 32a, and a third phase detector 32d for detecting a phase difference between identical signals (in this example, each of the identical signal is the data signal Dd and the phase difference is constantly 0).

Each of the phase detectors 32b to 32d is constituted by an EX-OR (exclusive OR) circuit and a LPF. The EX-OR circuit is adapted to judge whether or not two signals respectively having the compared phase are identical to each other. The LPF is adapted to pass a mean of direct-current of an outputted wave shape of the EX-OR circuit.

In the second phase detector 32c, bit error occurs in high probability, by the reason that the two data signals having the identical bit state are inputted to the second phase detector 36 under the state that the phase difference between the two signals is one bit. The output value P2 of the second phase detector 36 is, therefore, nearly equal to a maximum output voltage VH of the circuit element.

The output value P3 of the third phase detector 32d is nearly equal to a minimum output voltage VL (the base voltage) of the circuit element, by the reason that the two data signals having the identical bit state are inputted to the third phase detector 32d. The third phase detector 32d constitutes base voltage outputting means for outputting a base voltage of the output of the first and second phase detectors 32b and 32c. While the third phase detector 32d constituted by the same constructed phase detector as the other two phase detectors previously mentioned to cancel the influence of a temperature drift in this embodiment, the third phase detector 32d may be simply constituted by a power supply line fixed low level or a low level output line of an appropriate logical circuits according to the present invention.

The output value P1 of the first phase detector 32b is in the range between the voltages VH and VL, by the reason that the data signal Db and the decided data signal Dc having the identical bit state are inputted to the first phase detector 32b under the state that the phase difference between the two signals is within one bit.

In case that the phase of the data signal Db is nearly equal to that of the decided data signal Dc, the output value P1 becomes nearly equal to the voltage VL. In case that the phase of the data signal Db is shifted nearly one bit with respect to that of the decided data signal Dc, the output value P1 becomes nearly equal to the voltage VH.

Figure 5:
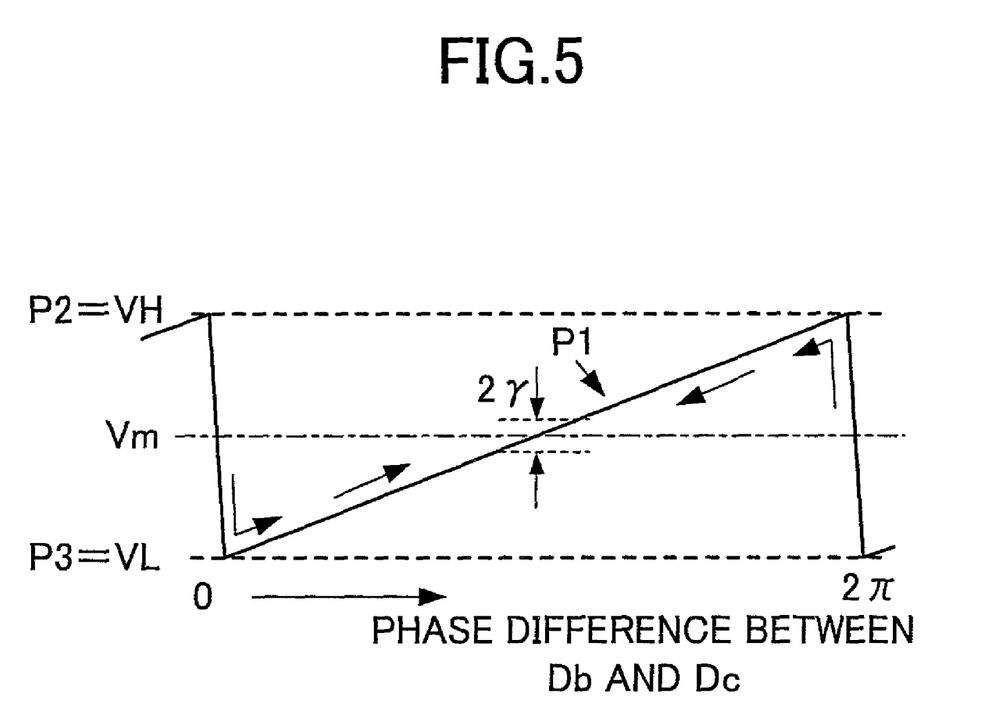
FIG. 5 is a graph to explain a method of the principal section of the preferred embodiment

As shown in FIG. 5, the output value P1 of the first phase detector 32b is monotonically increasing at a constant gradient from the voltage VL to the voltage VH in response to the phase difference φ varied from 0 to 2π between the data signal Db and the decided data signal Dc. This leads to the fact that the phase margin is the highest under the state that the output value P1 is equal to a center value Vm between the voltages VL and VH.

The phase controller 33 is operative to calculate a center voltage between the output values P2 and P3 as the center value Vm between the voltages VL and VH, and to compare an allowable voltage range Vm±γ given to the center value Vm with the output value P1. The phase controller 38 is operative to decrease a delay amount of the clock when the output value P1 is higher than Vm+γ, and to increase the delay amount of the clock when the output value P1 is lower than Vm−γ. The phase controller 38 is operative to bring the output value P1 into the allowable voltage range Vm±γ to keep the phase margin to be the highest (see arrows shown in FIG. 5).

The decided data signal Dc obtained by the manner above mentioned is inputted to the error measurement section 40 with the clock signal CKb.

The error measurement section 40 comprises a reference signal generator 41 for outputting a reference signal Dr to the bit comparator 42 in synchronism with the clock signal CKb. The reference signal Dr has the same bit string as that of the decided data signal Dc.

The bit comparator 42 is designed to make a judgment whether or not the bit of the decided data signal Dc is identical to that of the reference signal Dr to output the result of the judgment to the operation section 43. The operation section 43 is designed to calculate a bit error rate E by the result of the judgment of the bit comparator 42.

The bit string (i.e., pattern) used for the judgment is selectable by the user (The bit string is, generally, selected as the pattern identical to the pattern to be outputted from an evaluation object having the data signal with the reference pattern inputted thereto). The reference signal generator 41 has a function to output the mark ratio. The reference signal generator 41 is designed to produce the reference signal Dr having the bit string selected by a pattern selector 44.

In addition, the reference signal generator 41 is designed to output the mark ratio M of the selected pattern to the correction information outputting section 27.

While there has been described about the fact that the reference signal generator 41 is designed to calculate the mark ratio M on the basis of the selected pattern, the reference signal generator 41 may has a memory for preliminarily storing the mark ratios M corresponding to the respective patterns to be referenced at the time that the pattern is selected according to the present invention.

As will be seen from the foregoing description, it is to be understood that the preferred embodiment of the waveform shaping device 21 according to the present invention is designed to correct the reference voltage to be inputted to the comparator 25 on the basis of the mark ratio M and the amplitude of the inputted data Da. The waveform shaping device 21 can, therefore, perform the waveform shaping operation with the sufficient amplitude margin, even if the real mark ratio of the data signal is significantly varied and the amplitude of the data signal is decreased.

Although not illustrated in the drawings attached herewith, the waveform shaping device 21 may have a function to detect the value of the corrected reference voltage Vr', and a function to input the voltage having the detected value to the comparator 25 on an as-needed basis in place of the corrected reference voltage Vr' according to the present invention. The following description will be on the assumption that the correction section 28 has these functions. The correction section 28 is designed to detect the value of the corrected reference voltage Vr' to output a controller not illustrated. The controller can use the value of the voltage for operating or displaying as the offset value of the inputted data signal Da. In addition, the correction section 28 is designed to select the voltage to be inputted to the comparator 25 from the voltage having the detected value and the corrected reference voltage Vr' in accordance with the type of measurement. In this case, the threshold referenced by the comparator 25 to shape the waveform can be maintained to be constant, even if the amplitude of the inputted data Da is varied.

Second Preferred Embodiment

Figure 6:
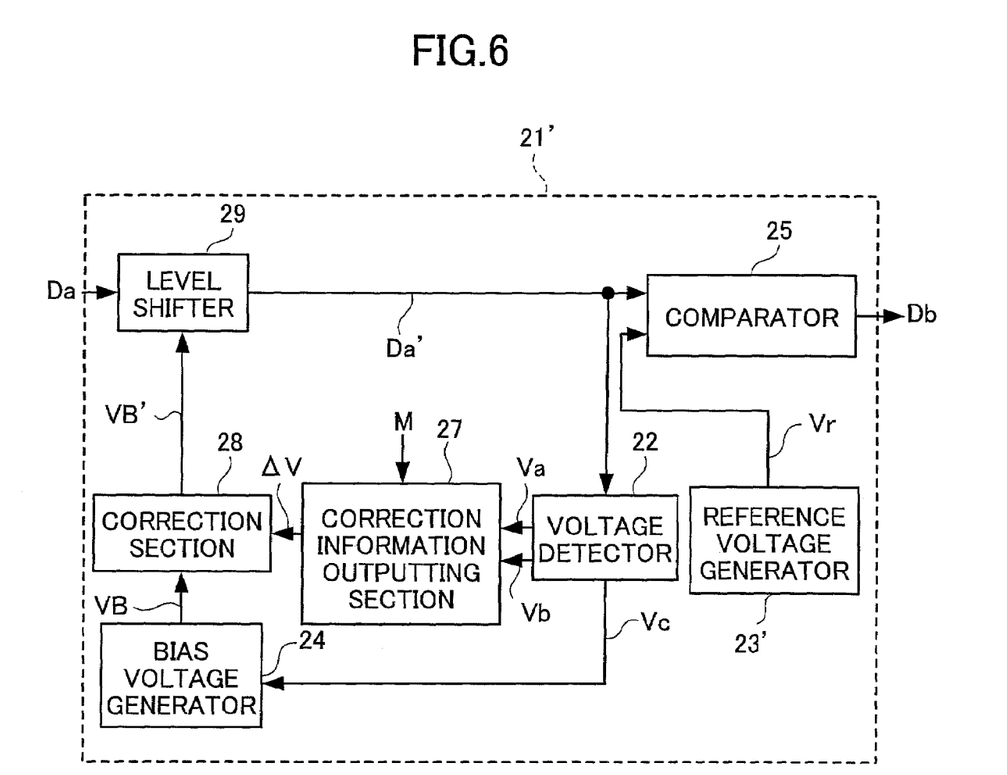
FIG. 6 is a block diagram showing an example of a construction of a second embodiment of a waveform shaping device according to the present invention having a level shifter.

While there has been described in the first preferred embodiment according to the present invention about the fact that the waveform shaping device 21 is designed to correct the reference voltage to be inputted to the comparator 25, the waveform shaping device 21 may be designed to shift the level of the inputted data signal Da as a waveform shaping device 21' shown in FIG. 6 according to the present invention.

The waveform shaping device 21' comprises a level shifter 29, a voltage detector 22, a reference voltage generator 23', a bias voltage generator 24, a comparator 25, a correction information outputting section 27, and a correction section 28.

The level shifter 29 is adapted to shift the level of the inputted data signal Da by a bias voltage VB' supplied from the correction section 28. The reference voltage generator 23' is designed to produce the reference voltage Vr.

The comparator 25 is adapted to compare the inputted data signal Da' having the level shifted by the level shifter 29 with the reference voltage Vr to produce the waveform-shaped data signal Db. The waveform-shaped data signal Db, for example, has a high level when the voltage of the inputted data signal Da' is higher than the reference voltage Vr and a low level when the voltage of the inputted data signal Da' is lower than or equal to the reference voltage Vr. The comparator 25 is adapted to output the waveform-shaped data signal Db to a decision device 30.

The voltage detector 22 is designed to detect the high and low level voltages Va and Vb and the center amplitude voltage Vc. The correction information outputting section 27 is designed to output the correction information $\varDelta$V on the basis of the mark ratio M outputted from the reference signal generator 41 and the amplitude value (Va−Vb) of the inputted data signal Da' with the shifted level.

The correction information $\varDelta$V is obtained by the same manner as previously mentioned in the first preferred embodiment according to the present invention.

The bias voltage generator 24 is, for example, constituted by a low pass filter to generate the bias voltage VB on the basis of the center amplitude voltage Vc detected by the voltage detector 22. In the case that pulsating of the center amplitude voltage Vc is sufficiently small, the bias voltage generator 24 may treat the center amplitude voltage Vc as the bias voltage VB according to the present invention.

The correction section 28 is designed to provide the level shifter 29 with the bias voltage VB' by use of the reference voltage Vr, the correction information $\varDelta$V, and the bias voltage VB in order to adjust the offset of the inputted data signal Da' to the reference voltage Vr.

As will be seen from the foregoing description, it is to be understood that the preferred embodiment of the waveform shaping device 21' according to the present invention is designed to correct the bias voltage VB' applied to the inputted data signal Da on the basis of the mark ratio M and the amplitude of the inputted data signal Da' having the level shifted. The waveform shaping device 21' can, therefore, perform the waveform shaping operation with the sufficient amplitude margin as the first preferred embodiment of the waveform shaping device 21 according to the present invention can perform, even if the real mark ratio of the data signal is significantly varied and the amplitude of the data signal is decreased.

Third Preferred Embodiment

There has been described in the above preferred embodiments according to the present invention about the fact that the inputted data signal Da is single-ended. In case that the inputted data signal is constituted by a differential input Da and an inversion of the input Da, the waveform shaping device 21" shown in FIG. 7 can perform the waveform shaping operation with the sufficient amplitude margin, even if the real mark ratio of the data signal is significantly varied and the amplitude of the data signal is decreased.

Figure 7:
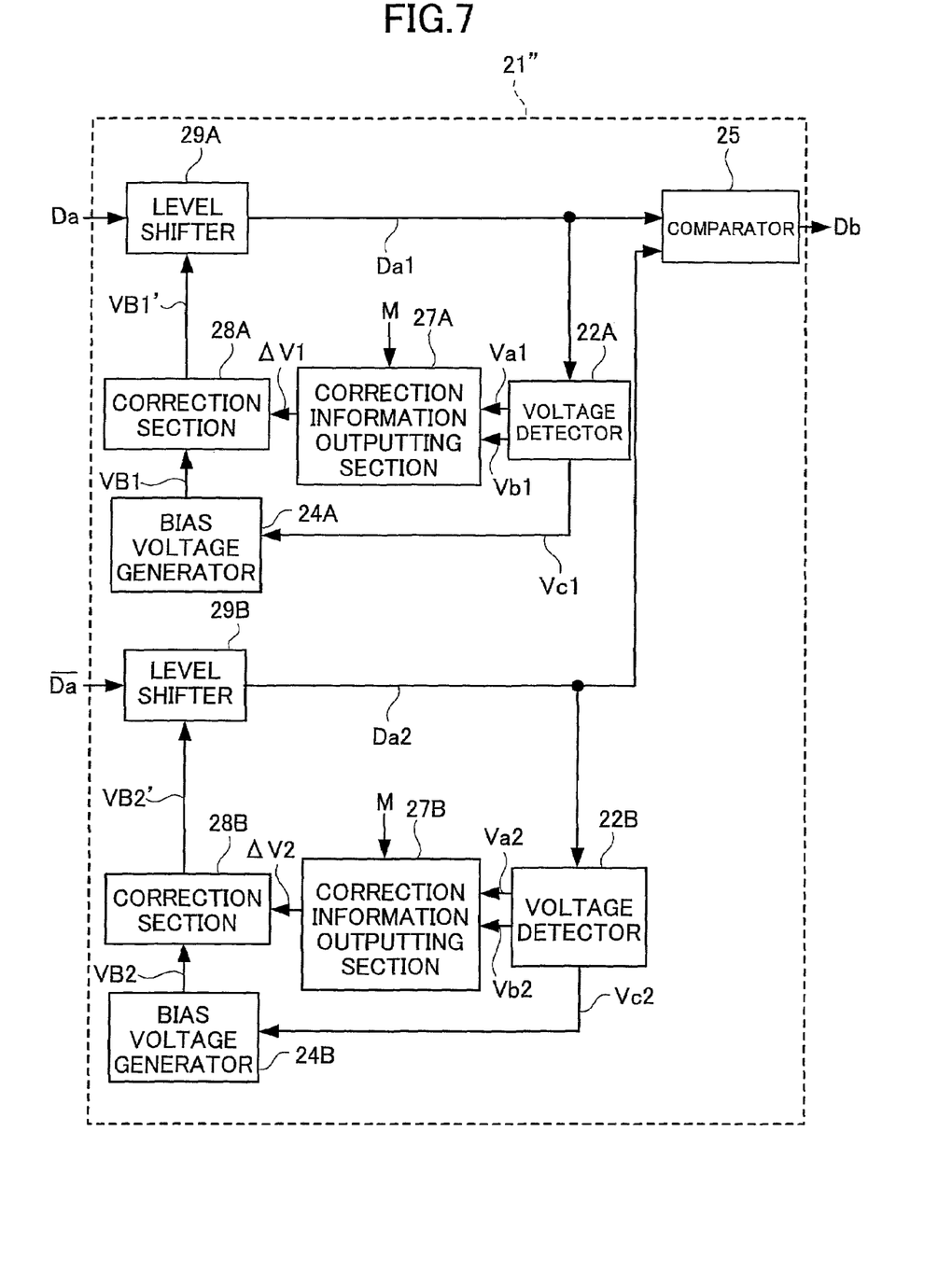
FIG. 7 is a block diagram showing an example of a construction of a third preferred embodiment.

While there has been shown in FIG. 6 about the fact that the reference voltage signal inputted to the comparator 25 has a direct-current voltage, the reference voltage signal is the inversion data signal in this example. The waveform shaping device 21" is designed to control the direct-current offset voltages of the respective inputted data signals Da1 and Da2 inputted to the comparator 25 to equalize to each other.

More specifically, the waveform shaping device 21" is designed to correct the bias voltage VB1 outputted from the bias voltage generator 24A in a manner similar to the second preferred embodiment according to the present invention to provide the level shifter 29A with the corrected bias voltage VB1'. The level shifter 29A is, therefore, capable of outputting to the comparator 25 a data signal Da1. The data signal Da1 is the inputted data signal Da level shifted to a predetermined offset.

The waveform shaping device 21" is, similarly, designed to correct the bias voltage VB2 outputted from the bias voltage generator 24B in a manner similar to the second preferred embodiment according to the present invention to provide the level shifter 29B with the corrected bias voltage VB2'. The level shifter 29B can, therefore, output a data signal Da2 to the comparator 25. The data signal Da2 is the inversion of the inputted data signal Da level shifted to a predetermined offset.

For these reasons, the real center amplitude value Vcr1 of the inputted data signal Da and the real center amplitude value Vcr2 of the inversion of the inputted data signal Da are controlled to be equalized to each other. This results in the fact that the waveform shaping device 21" can perform the waveform shaping operation with the sufficient amplitude margin, even if the real mark ratio of the data signal is significantly varied and the amplitude of the data signal is decreased.

In this embodiment, the waveform shaping device 21" may have the second correction information outputting section 27B removed under the state that the second correction section 28B is provided with the inversion of the first correction information $\Delta V1$ to be outputted to the correction section 28A according to the present invention. In contrast, the waveform shaping device 21" may have the first correction information outputting section 27A removed under the state that the second correction section 28A is provided with the inversion of the second correction information $\Delta V2$ to be outputted to the second correction section 28B according to the present invention.

What is claimed is:

1. A waveform shaping device comprising:
a comparator (25) for comparing an inputted data signal with a threshold to shape a waveform of said inputted data signal; and
a voltage detector (22) for detecting an amplitude voltage and a center amplitude voltage of said inputted data signal, and in which said waveform shaping device further comprises:
a correction information outputting section (27) for outputting correction information on the basis of a mark ratio (M) of said inputted data signal and said amplitude voltage; and
a correction section (28) for correcting one of direct-current offset values of said inputted data signal and said threshold on the basis of the correction information outputted from said correction information outputting section.

2. A waveform shaping device as set forth in claim 1, in which
said correction information is determined on the basis of at least one coefficient and said amplitude voltage detected by said voltage detector, said coefficient preliminarily determined in accordance with each combination of an ambient temperature of said waveform shaping device, a bit rate of the inputted data signal, and said mark ratio of the inputted data signal.

3. An error measurement device comprising:
a waveform shaping device for shaping a waveform of an inputted data signal;
a variable delay device (31) for relatively shifting phases of said waveform-shaped data signal and an inputted clock; and
a decision device (30) for reading a bit state from said waveform-shaped data signal while receiving said waveform-shaped data signal and said inputted clock signal relatively phase shifted by said variable delay device, said error measurement device designed to measure a bit error of said inputted data signal on the basis of a decided data signal outputted from said decision device, and in which
said waveform shaping device is designed as set forth in claim 1.

4. An error measurement device as set forth in claim 3, further comprising
a reference signal generator (41) for outputting a mark ratio of a specified reference signal as that of said waveform-shaped data signal to said correction information outputting section.

5. An error measurement device as set forth in claim 3, further comprising:
a delay device (32a) for delaying in units of bits said decided data signal outputted from said decision device;
a first phase detector (32b) for outputting a voltage corresponding to a phase difference between said data signal outputted from said waveform shaping device and said decided data signal outputted from said decision device;
a second phase detector (32c) for outputting a voltage corresponding to a phase difference between said decided data signal and a data signal outputted from said delay device;
a third phase detector (32d) for outputting a base voltage with respect to said voltage outputted from said first phase detector; and
a phase controller (33) for controlling a phase shift amount of said variable delay device to equalize said voltage outputted from said first phase detector to a center voltage between said voltage outputted from said second phase detector and said base voltage.

6. An error measurement device as set forth in claim 5, in which
said first to third phase detectors are respectively constituted by identically constructed phase detectors, and
said third phase detector is designed to output said base voltage corresponding to a phase difference between digital data signals having the identical bit, and identical phase.

7. A waveform shaping device (21') comprising:
a first voltage detector (22A) for detecting a first amplitude voltage and a first center amplitude voltage of a first inputted data signal constituting a differential digital signal;
a second voltage detector (22B) for detecting a second amplitude voltage and a second center amplitude voltage of a second inputted data signal constituting said differential digital signal;
a comparator (25) for comparing said first inputted data signal with said second inputted data signal to convert said differential digital signal into a digital signal, and in which said waveform shaping device further comprises:
a first correction information outputting section (27A) for outputting first correction information on the basis of a mark ratio of said first inputted data and said first amplitude voltage;
a first correction section (28A) for correcting a direct-current offset value of said first inputted data signal on the basis of said first correction information;
a second correction information outputting section (27B) for outputting second correction information on the basis of a mark ratio of said second inputted data and said second amplitude voltage;
a second correction section (28B) for correcting a direct-current offset value of said second inputted data signal on the basis of said second correction information.

8. An error measurement device comprising:
a waveform shaping device (21") for comparing first inputted data signal with second inputted data signal constituting a differential digital signal to output a waveform-shaped data signal while receiving said differential digital signal;

a variable delay device (31) for relatively shifting phases of said waveform-shaped data signal and an inputted clock; and a decision device (30) for reading a bit state from said waveform-shaped data signal while receiving said waveform-shaped data signal and said inputted clock signal relatively phase shifted by said variable delay device, said error measurement device designed to measure a bit error of said differential digital signal on the basis of a decided data signal outputted from said decision device, and in which said waveform shaping device (21″) is designed as set forth in claim 7.

9. An error measurement device as set forth in claim 8, further comprising a reference signal generator (41) for outputting a mark ratio of a specified reference signal as that of said differential digital signal to said first and second correction information outputting sections.

10. An error measurement device as set forth in claim 8, further comprising:

a delay device (32*a*) for delaying in units of bits said decided data signal outputted from said decision device;

a first phase detector (32*b*) for outputting a voltage corresponding to a phase difference between said data signal outputted from said waveform shaping device and said decided data signal outputted from said decision device;

a second phase detector (32*c*) for outputting a voltage corresponding to a phase difference between said decided data signal and a data signal outputted from said delay device;

a third phase detector (32*d*) for outputting a base voltage with respect to said voltage outputted from said first phase detector; and a phase controller (33) for controlling a phase shift amount of said variable delay device to equalize said voltage outputted from said first phase detector to a center voltage between said voltage outputted from said second phase detector and said base voltage.

11. An error measurement device as set forth in claim 10, in which said first to third phase detectors are respectively constituted by identically constructed phase detectors, and said third phase detector is designed to output said base voltage corresponding to a phase difference between digital data signals having the identical bit, and identical phase.

\* \* \* \* \*

UNITED STATES PATENT AND TRADEMARK OFFICE
CERTIFICATE OF CORRECTION

Page 1 of 1

PATENT NO. : 8,005,134 B2
APPLICATION NO. : 12/295227
DATED : August 23, 2011
INVENTOR(S) : Yamane et al.

It is certified that error appears in the above-identified patent and that said Letters Patent is hereby corrected as shown below:

In the Claims:

Claim 7   Delete "(21')" and replace it with --(21")--.
Col. 12, Line 35

Signed and Sealed this
Eleventh Day of September, 2012

David J. Kappos
*Director of the United States Patent and Trademark Office*